United States Patent [19]
Takeuchi et al.

[11] Patent Number: 5,126,615
[45] Date of Patent: Jun. 30, 1992

[54] PIEZOELECTRIC/ELECTROSTRICTIVE ACTUATOR HAVING AT LEAST ONE PIEZOELECTRIC/ELECTROSTRICTIVE FILM

[75] Inventors: Yukihisa Takeuchi, Aichi; Koji Kimura, Nagoya, both of Japan

[73] Assignee: NGK Insulators, Ltd., Aichi, Japan

[21] Appl. No.: 672,330

[22] Filed: Mar. 20, 1991

[30] Foreign Application Priority Data

May 1, 1990 [JP] Japan .................................. 2-115665

[51] Int. Cl.⁵ .......................................... H01L 41/08
[52] U.S. Cl. ................................... 310/330; 310/324; 310/328; 310/332; 310/366; 310/358; 310/359
[58] Field of Search ................... 310/357–359, 310/324, 328, 365, 366, 346, 330–332; 252/629

[56] References Cited

U.S. PATENT DOCUMENTS 4,435,667  3/1984  Kolm et al. .......................... 310/367
5,038,069  8/1991  Lukasiewicz et al. ............... 310/346

FOREIGN PATENT DOCUMENTS 0257929  8/1987  European Pat. Off. .
0159777  7/1986  Japan ..................................... 36/346

Primary Examiner—Mark O. Budd
Attorney, Agent, or Firm—Parkhurst, Wendel & Rossi

[57] ABSTRACT

A piezoelectric/electrostrictive actuator having at least one piezoelectric/electrostrictive unit each including a first electrode film, a piezoelectric/electrostrictive film and a second electrode film which are superposed on each other on a ceramic substrate, or at least one piezoelectric/electrostrictive unit each including a plurality of patterned spaced-apart electrode film strips formed on a ceramic substrate, and a plurality of patterned spaced-apart piezoelectric/electrostrictive film strips each formed on the ceramic substrate and disposed between and in contact with adjacent ones of the electrode film strips. The ceramic substrate includes ceramic particles and grain boundaries defined by the ceramic particles. Lead is included in the grain boundaries which exist in at least a selected portion of the ceramic substrate on which the unit or units is/are disposed.

11 Claims, 4 Drawing Sheets

PIEZOELECTRIC/ELECTROSTRICTIVE ACTUATOR HAVING AT LEAST ONE PIEZOELECTRIC/ELECTROSTRICTIVE FILM

BACKGROUND OF THE INVENTION

1. Field of the Invention

The present invention relates to a uni-morph, bi-morph or other types of piezoelectric or electrostrictive actuators which undergo displacement in the form of bending, deflection or flexure and which can be used as or for displacement-controllable elements, solid element motors, relays, switching elements, camera shutters, print heads, pumps, fans or blowers, microphones, sounding bodies (such as a speaker), ink jet ejectors, and other components or devices. The term "actuator" used herein is a member capable of transducing or converting an electric energy into a mechanical force, displacement or strain.

2. Discussion of the Prior Art

Recently, an element whose displacement can be controlled has been widely used and increasingly needed in the fields of optics and precision positioning or machining operations, for example, for adjusting or changing an optical path length or the position of a member or component of a device, on the order of fractions of a micron ($\mu$m). To meet this need, there have been proposed and developed various piezoelectric or electrostrictive actuators utilizing a piezoelectric or electrostrictive material such as a ferroelectric material, which exhibits the reverse or converse piezoelectric effect or the electrostrictive effect, in which such a piezoelectric or electrostrictive material produces a mechanical displacement upon application of a voltage or electric field thereto.

Conventionally, the piezoelectric/electrostrictive actuator is structurally classified into a mono-morph type, a uni-morph type, a bi-morph type and a lamination type. The mono-morph, uni-morph and bi-morph types provide a relatively large amount of bending or flexural displacement or deflection or distortion owing to the transverse mode of the reverse piezoelectric effect or electrostrictive effect, namely, due to the strain perpendicular to the direction of the electric field produced upon application of a voltage. These types, however, suffer from inherent problems such as a small magnitude of a force generated, a low response speed, and a low level of electro-mechanical conversion efficiency. On the other hand, the lamination type utilizes the longitudinal mode of the reverse piezoelectric effect or electrostrictive effect, namely, the strain parallel to the direction of the electric field, and therefore assures a large magnitude of the generated force, a high response speed, and a high level of electro-mechanical conversion efficiency. However, the lamination type suffers from an inherent problem that the amount of displacement produced is relatively small.

The conventional piezoelectric/electrostrictive actuator of the uni-morph or bi-morph type also suffers from a relatively low operating reliability, which arises from the use of a bonding agent for bonding together the component sheets or plates of the actuator such as piezoelectric/electrostrictive elements or layers.

Thus, the conventional piezoelectric or electrostrictive actuators have drawbacks as well as advantages, and suffer from some problems that should be solved.

SUMMARY OF THE INVENTION

It is accordingly an object of the present invention to provide a piezoelectric/electrostrictive actuator of uni-morph or bi-morph type which does not use a bonding adhesive or cement and which undergoes a sufficient amount of displacement by application of a relatively low voltage, with an improved response to the applied voltage.

The above object may be achieved according to the principle of the present invention, which provides a piezoelectric/electrostrictive actuator having at least one piezoelectric/electrostrictive unit each including a first electrode film, a piezoelectric/electrostrictive film and a second electrode film which are superposed on each other on a ceramic substrate, or at least one piezoelectric/electrostrictive unit each including a plurality of patterned spaced-apart electrode film strips formed on a ceramic substrate, and a plurality of patterned spaced-apart piezoelectric/electrostrictive film strips which are formed on the ceramic substrate and each of which are disposed between and in contact with adjacent ones of the electrode film strips. The ceramic substrate includes ceramic particles and grain boundaries defined by the ceramic particles. The present actuator is characterized in that lead element is contained in the grain boundaries existing in at least a selected portion of the ceramic substrate on which the unit or units is/are disposed.

The present piezoelectric/electrostrictive actuator, which is a laminar structure as described above, is capable of providing a sufficiently large amount of displacement or force with a relatively low voltage, and with an improved operating response. Further, the piezoelectric/electrostrictive units may be provided on the ceramic substrate, with an increased integration density.

In the present actuator, any adhesive agent conventionally used for bonding thin components sheets of a known uni-morph or bi-morph actuator is not used for bonding between the ceramic substrate and the electrode film or film strips, between the ceramic substrate and the piezoelectric/electrostrictive film or film strips, or between the electrode film or film strips and the piezoelectric film or film strips. Accordingly, the present actuator has increased operational reliability and durability, and reduced displacement drift.

Particular attention is directed to the material of the grain boundaries which exist in the portion of the ceramic substrate on which the piezoelectric/electrostrictive unit or units is/are disposed. Namely, the grain boundaries in that portion of the substrate have a composition which has a relatively low melting point and which includes lead element. This composition permits strong bonding between the ceramic substrate and the electrode and piezoelectric/electrostrictive film or film strips, and further functions to mitigate stresses between the substrate and the piezoelectric/electrostrictive film or film strips, after the heat-treatment thereof. As a result, the piezoelectric/electrostrictive film can be made sufficiently dense, permitting efficient transmission of a force to the substrate which acts as a vibrating plate.

In the ceramic substrate of the present piezoelectric/electrostrictive actuator, lead is generally present in the form of a compound such as an oxide in the grain boundaries defined by the surfaces of poly-crystalline ceramic particles. It is generally desirable that the grain boundaries contain at least 40% by weight of lead element, preferably at least 50% by weight, more preferably at least 60% by weight.

Since each piezoelectric/electrostrictive unit is a laminar structure, a comparatively large number of piezoelectric/electrostrictive units may be easily formed on the major surface of the ceramic substrate, with high density of integration.

For the piezoelectric/electrostrictive actuator to produce a large force or a large amount of bending or flexural displacement with a relatively low voltage applied thereto, it is desirable that the actuator has an overall thickness of no more than 300 μm, preferably no more than 150 μm, while the ceramic substrate has a thickness of no more than 100 μm, preferably 50 μm.

BRIEF DESCRIPTION OF THE DRAWINGS

The above and optional objects, features and advantages of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1:
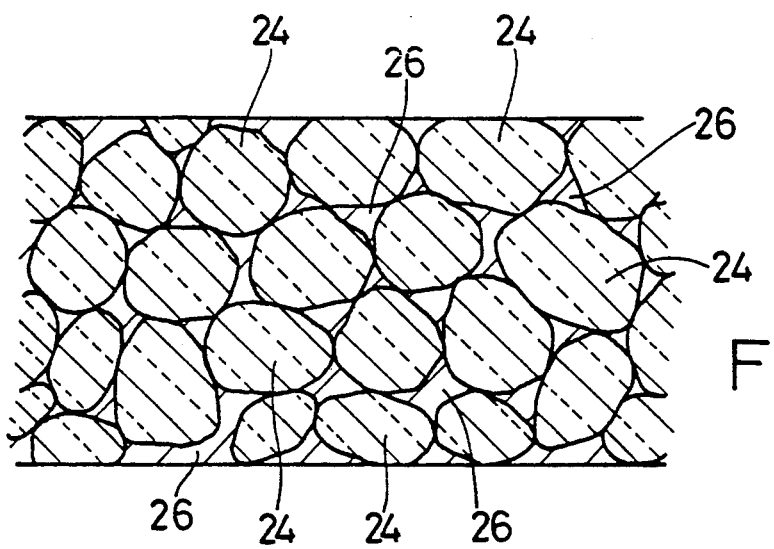
FIG. 1 is a fragmentary enlarged view in cross section of a ceramic substrate of a piezoelectric/electrostrictive actuator according to the present invention.

Referring first to FIG. 1, there is illustrated a polycrystalline ceramic substrate used for a piezoelectric/electrostrictive actuator according to the principle of the present invention. This ceramic substrate includes ceramic particles 24 which constitute a major component, and grain boundaries 26 defined by the surfaces of the ceramic particles 24. The grain boundaries 26 include a composition which has a low melting point and in which lead (Pb) is diffused in the form of a compound such as an oxide. The present ceramic substrate including the grain boundaries 26 as shown in FIG. 1 is distinguished from a conventional ceramic substrate in which only quartz glass or similar compositions exist in the grain boundaries between the individual ceramic particles.

On the ceramic substrate whose grain boundaries 26 includes lead in the form of an oxide or other compound in a suitable amount, preferably at least 40% by weight, there is formed at least one piezoelectric/electrostrictive unit. The grain boundaries 26 contribute to an increase in the density of the piezoelectric/electrostrictive film of each unit, and an improvement in the bonding strength between the substrate and the unit. Consequently, the ceramic substrate having the grain boundaries 26 is conducive to enhanced operating characteristics of the piezoelectric/electrostrictive actuator.

It is required that the oxide or other compound including lead (Pb) be provided at least in a portion of the ceramic substrate on which a piezoelectric/electrostrictive unit or units is/are formed. Further, the compound is preferably included in the grain boundaries throughout the entire thickness of such portion of the substrate. Most preferably, the compound is evenly or uniformly included throughout the entire mass of the ceramic substrate.

There will be some examples of the piezoelectric/electrostrictive actuator which uses the ceramic substrate having the structure as shown in FIG. 1.

Figure 2:
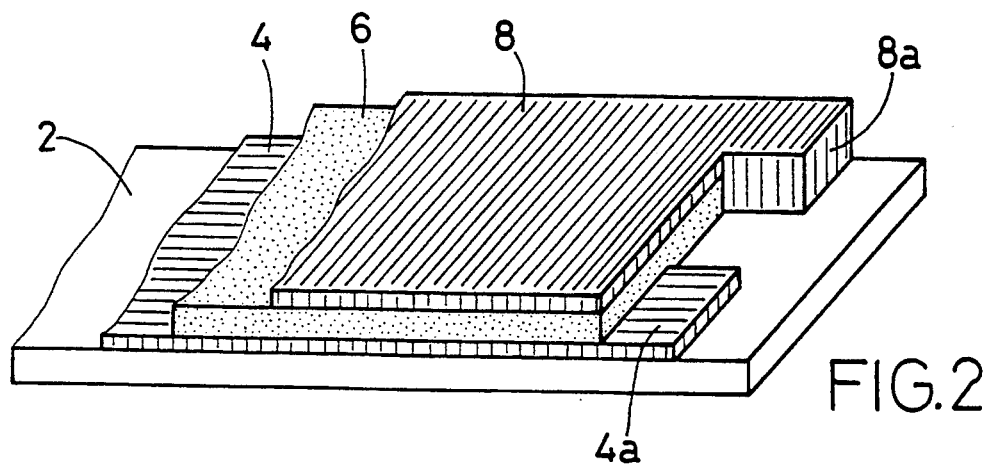
FIGS. 2 through FIG. 9 are fragmentary perspective views illustrating different forms of the piezoelectric/electrostrictive actuator of the invention.

Referring to FIG. 2, there is shown a piezoelectric/electrostrictive unit formed on one of opposite major surfaces of a generally elongate rectangular ceramic substrate 2. The piezoelectric/electrostrictive unit is a laminar structure consisting of a first electrode film 4, a piezoelectric/electrostrictive film 6 and a second electrode film 8, which are integrally formed on the substrate in the order of description. The first and second electrode films 4, 8 have respective terminal portions 4a, 8a which extend beyond the appropriate end face of the piezoelectric/electrostrictive film 6. In operation of the actuator, a voltage is applied between the electrode films 4, 8 through the terminal portions 4a, 8a. When the piezoelectric/electrostrictive film 6 (hereinafter referred to "piezoelectric film 6") is exposed to an electric field produced by a voltage applied thereto through the electrode films 4, 8, the actuator generates a force, or undergoes displacement in the form of bending or deflection, in the direction perpendicular to the major surfaces of the ceramic substrate 2, due to the transverse piezoelectric or electrostrictive effect.

Figure 3:
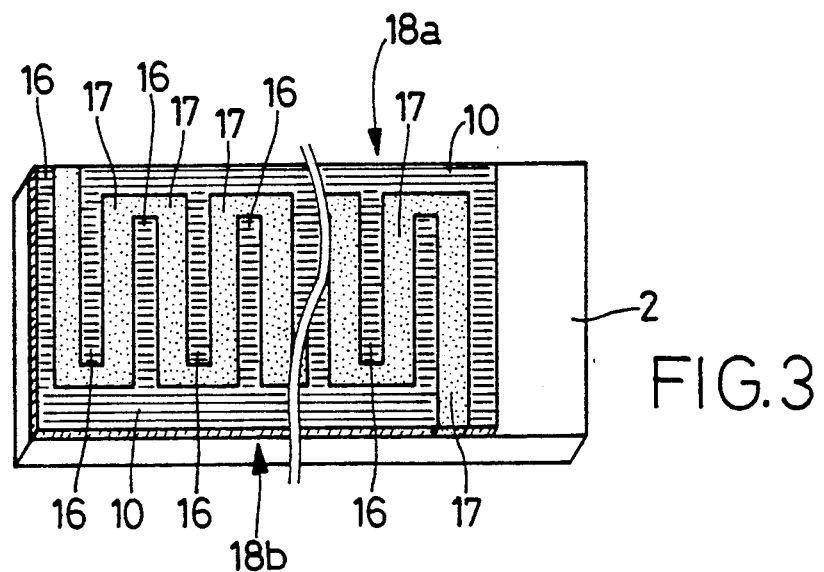

In the piezoelectric/electrostrictive actuator shown in FIG. 3, a pair of comb-like electrode film patterns 18a, 18b are formed on the ceramic substrate 2. Each electrode film pattern 18a, 18b has a plurality of electrode film strips 16 connected to each other by a connecting portion 10. Each electrode film strip 16 of one of the two patterns 18a, 18b is disposed between the adjacent film strips 16 of the other pattern 18b, 18a, in spaced part relation with each other in the direction of extension of the connecting portions 10. Namely, the electrode film strips 16 of the electrode film pattern 18a and the film strips 16 of the other electrode film pattern 18b are disposed alternately in the direction of extension of the connecting portions 10, 10. Between each pair of the adjacent electrode film strips 16, there is formed a piezoelectric/electrostrictive film strip 17 (hereinafter referred to as "piezoelectric film strip 17") in contact with the electrode film patterns 18a, 18b. In the present actuator, an electric field is applied to the piezoelectric film strips 17 in the direction parallel to the major surfaces of the ceramic substrate 2, whereby the actuator generates a force or undergoes bending or deflection in the direction perpendicular to the plane of the substrate 2, due to the longitudinal piezoelectric or electrostrictive effect.

Figure 4:
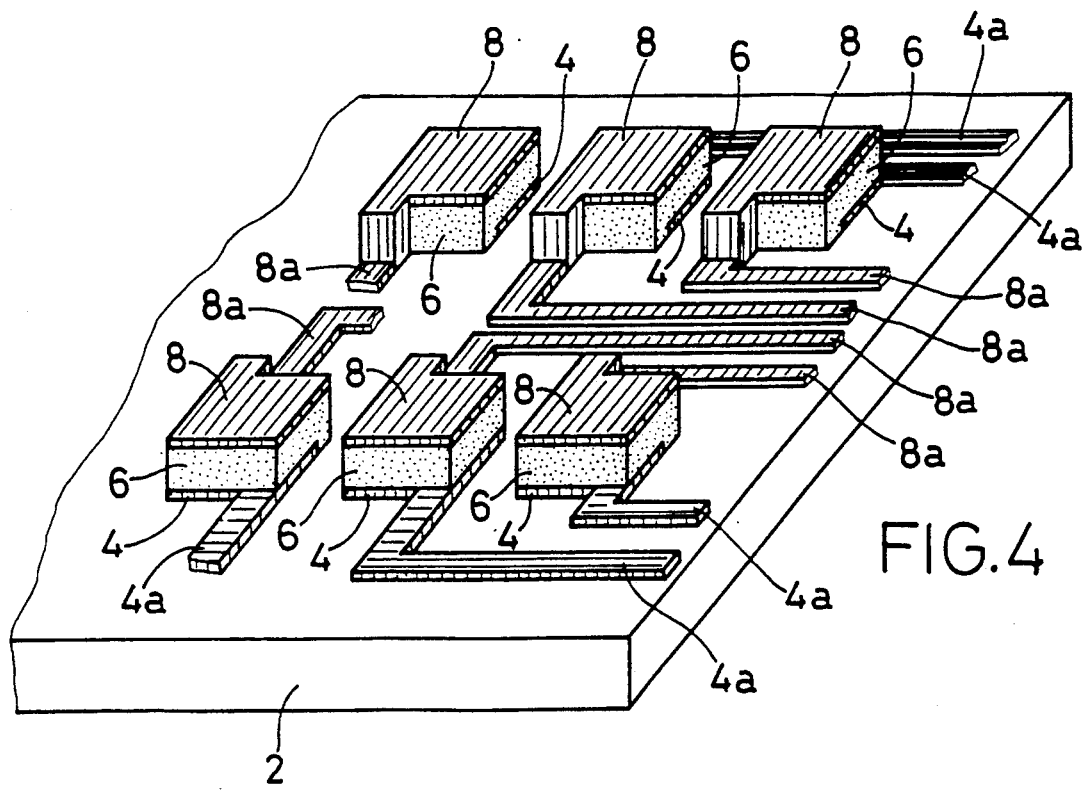

The piezoelectric/electrostrictive actuator shown in FIG. 4 has a plurality of piezoelectric/electrostrictive units each of which consists of the first electrode film 4, the piezoelectric film 6 and the second electrode film 8. The units have a laminar structure similar to that of FIG. 2, and are disposed on the ceramic substrate 2, in spaced-apart and mutually independent relation with each other, with a relatively high integration density.

Figure 5:
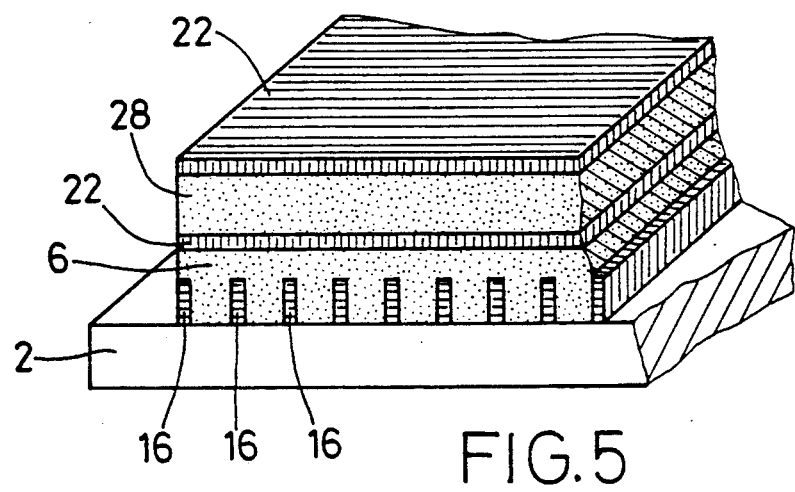

Referring next to FIG. 5, there is shown another form of the piezoelectric/electrostrictive actuator, in which the electrode film patterns 18a, 18b are formed on one major surface of the ceramic substrate 2 such that the electrode film strips 16 are equally spaced apart from each other by a suitable spacing distance. The array of the electrode film strips 16 is embedded in the piezoelectric film 6, to provide the piezoelectric/electrostrictive unit. The actuator has a second unit consisting of an electrode film 22, a piezoelectric/electrostrictive film 28 (hereinafter referred to as "piezoelectric film 28") and another electrode film 22 which are formed on each other. The instant actuator utilizes both of the transverse and longitudinal piezoelectric or electrostrictive effects.

Figure 6:
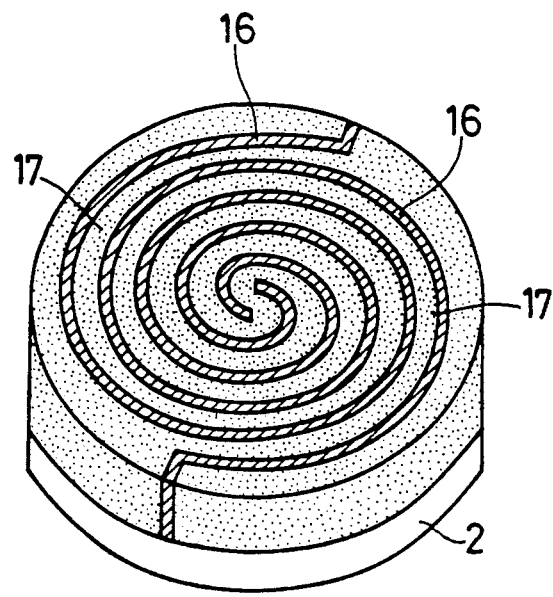

In the piezoelectric/electrostrictive actuator shown in FIG. 6, the ceramic substrate 2 has a circular shape, the electrode film strips 16 take the form of two spiral film strips on one of the opposite major surfaces of the substrate 2. The piezoelectric film strips 17 are formed so as to fill spiral spaces defined between the two spiral electrode film strips 16.

Figure 7:
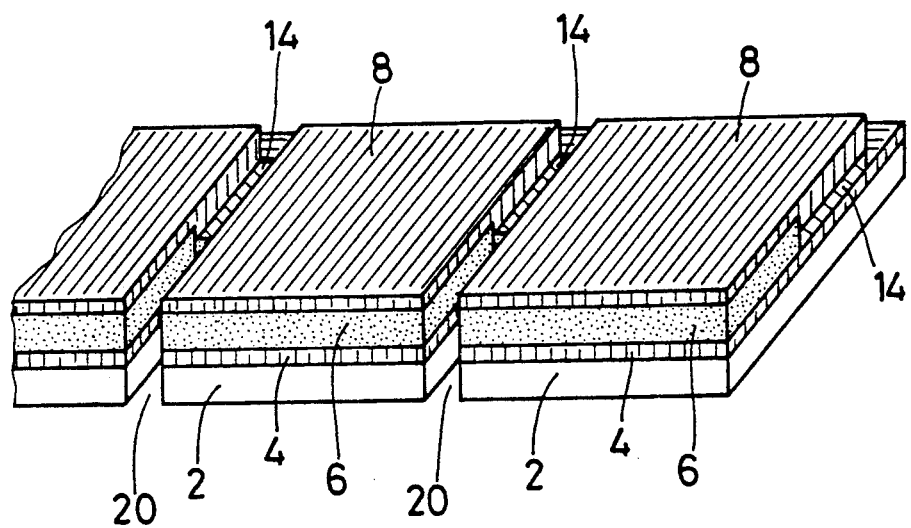
Figure 8:
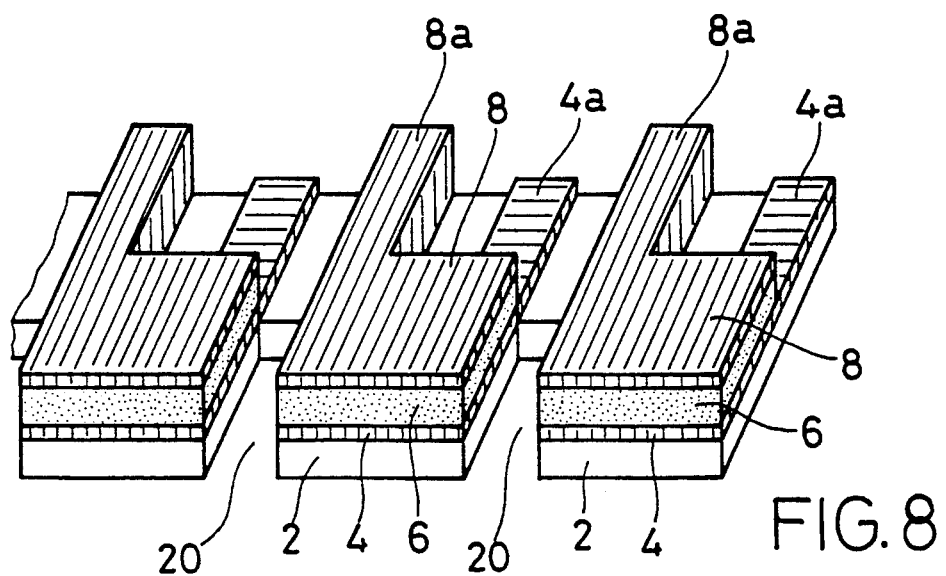
Figure 9:
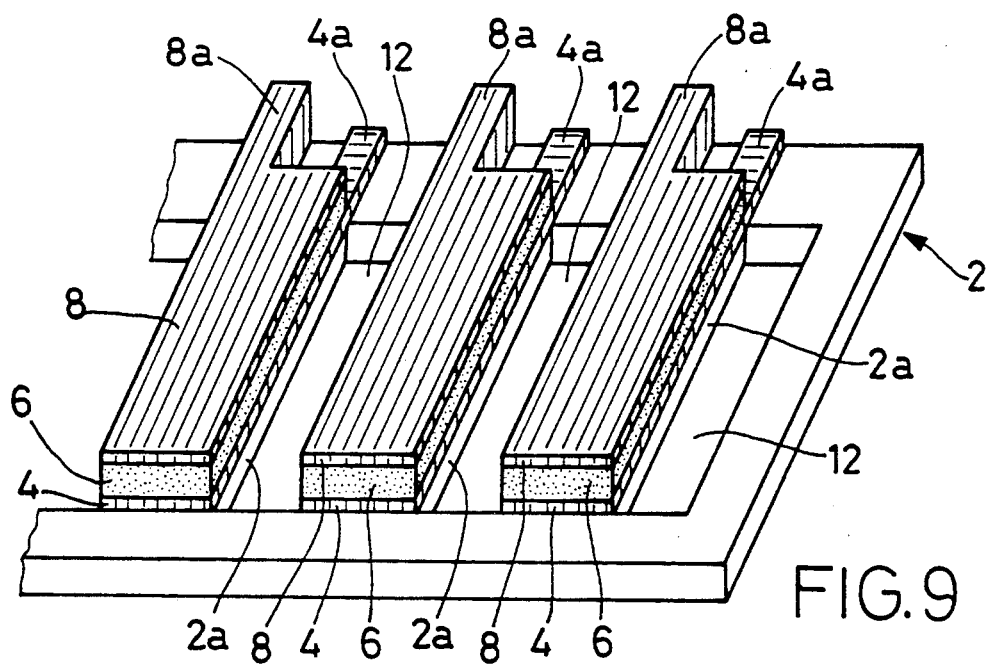

In the examples of FIGS. 7, 8 and 9, a plurality of piezoelectric/electrostrictive units (4, 6, 8) are formed in parallel with each other on the same major surface of the elongate substrate 2, such that the piezoelectric/electrostrictive units (4, 6, 8) are spaced from each other in the longitudinal direction of the substrate 2. In the actuator of FIGS. 7 and 8, the piezoelectric/electrostrictive units (4, 6, 8) are separated from each other by rectangular slots 20 formed in respective portions of the ceramic substrate 2, each located between the adjacent piezoelectric/electrostrictive units. The actuator of FIG. 7 has insulating films 14 which cover a rear part of the exposed end face of the piezoelectric film 6, for electrically insulating the first and second electrode films 4, 8. In the actuator of FIG. 9, the ceramic substrate 2 has a plurality of elongate rectangular holes 12 formed therethrough at a suitable pitch in the longitudinal direction, so as to define a plurality of beam portions 2a. On each of the beam portions 2a of the substrate 2, there is formed a piezoelectric/electrostrictive unit (4, 6, 8).

In the piezoelectric/electrostrictive actuator constructed according to the present invention, the electrode films 4, 8, 22 or electrode film strips 16 (electrode film patterns 18) and the piezoelectric film 6, 28 or film strips 17 are formed of suitable electrode and piezoelectric or electrostrictive materials, so as to provide a laminar structure of the piezoelectric/electrostrictive unit, which is integrated, by heat treatment. Namely, the piezoelectric/electrostrictive unit is bonded to the ceramic substrate in the fabrication process, without using any bonding adhesive. There will be described the fabrication process of the present actuator.

The ceramic substrate (2) which bears the piezoelectric/electrostrictive unit or units may be formed of an electrically insulating or dielectric material which has a sufficiently high mechanical strength and which may be heat-treated at a temperature between 800° C. and 1500° C., as described below. The insulating or dielectric material may be an oxide or non-oxide composition, which preferably includes as a major component or components at least one of aluminum oxide, magnesium oxide, zirconium oxide, aluminum nitride and silicon nitride. It is noted that the term "major component" is interpreted to mean a component whose content is at least 50% by weight of the entire composition. Since lead (Pb) is included in the form of an oxide or other compound in the grain boundaries of the ceramic particles of the ceramic substrate, an electrically insulating or dielectric composition including aluminum oxide and/or zirconium oxide as the major component or components is recommended for the material of the ceramic substrate, in order for the actuator to exhibit excellent characteristics with a relatively small thickness of the ceramic substrate. Most preferably, the ceramic substrate is formed of a composition whose major component is aluminum oxide.

The ceramic composition for the ceramic substrate may advantageously include SiO or $SiO_2$, preferably in an amount of 0.5–5% by weight, more preferably in an amount of 1–3% by weight. The inclusion of SiO or $SiO_2$ is effective to prevent excessive reaction of the ceramic composition with the piezoelectric or electrostrictive material during the heat treatment, which reaction influences the properties of the actuator obtained. Further, the inclusion of SiO or $SiO_2$ is important for providing the ceramic substrate with the grain boundaries which contain a low-melting-point material in which lead (Pb) is uniformly included in the form of an oxide.

Lead (Pb) may be included in the grain boundaries of the ceramic substrate, in the form of a compound such as an oxide, by one of the following methods, for example. According to the first method, the ceramic substrate is heat-treated in an atmosphere containing lead alone or a compound including lead, at a temperature not lower than 700° C., that allows the lead to diffuse through the grain boundaries of the ceramic particles of the substrate, in the form of an oxide or other compound. The second method is to use a green sheet which contains or is coated with lead alone or a compound such as an oxide or oxygen acid salt. The green sheet is fired into the ceramic substrate whose grain boundaries include lead. The third method is to heat-treat the ceramic substrate which carries a mass or masses of lead alone or a compound including lead, at desired portions of a major surface thereof. Alternatively, the desired portions of the major surface of the substrate is coated with a paste including lead or lead compound. Thus, lead can be introduced into the grain boundaries in the desired portions (entire portion) of the ceramic substrate.

The heat treatment for introducing lead into the grain boundaries of the ceramic substrate may be effected either before the piezoelectric/electrostrictive unit or units is/are formed on the substrate, or alternatively at the time when the unit or units on the ceramic substrate is/are heat-treated, i.e., when the electrode films (film strips) and piezoelectric film (film strips) are fired. In the latter case, the unfired laminar structure of the actuator is fired in an atmosphere which contains lead alone or a compound including lead.

To assure a high level of operating response and a large amount of bending or flexural displacement or deflection, the thickness of the ceramic substrate is preferably no more than 100 μm, more preferably no more than 50 μm, and most preferably no more than 30 μm. The bending strength of the ceramic substrate is preferably more than 500kgf/cm$^2$, more preferably more than 1000kgf/cm$^2$.

The green sheet for the ceramic substrate may be fired before the unit or units (4, 6, 8, 16, 17, 22, 28) is/are formed on the fired substrate. Alternatively, the unfired unit or units is/are formed on the green sheet for the ceramic substrate, and the unit or units is/are co-fired with the green sheet. For reducing the amount of warpage of the produced actuator and improving the dimensional and patterning accuracy of the unit or units, it is desirable to form the unit or units on the pre-fired ceramic substrate.

The ceramic substrate may have a desired shape or configuration, depending upon the utility or application of the actuator. For example, the substrate has a polygonal shape such as a triangle or square, a generally round shape such as a circle, ellipse or annulus, or any special shapes such as a comb-like or lattice-like shape, and a combination of the two or more shapes indicated above.

Each piezoelectric/electrostrictive unit (4, 6, 8, 16, 17, 22, 28) is formed on the ceramic substrate by suitable known methods. For example, the planar electrode films (4, 8, 22) or electrode film pattern 18 and the planar piezoelectric film (6, 28) or film strips (17) may be formed of respective materials, by a thick-film forming process such as screen printing, coating process such as dipping, or thin-film forming process such as sputtering, vacuum vapor deposition and plating. However, the other methods may be practiced. For the planar piezoelectric films (6, 28) or film strips (17), it is desirable to use the screen printing or dipping method or coating process, which permits easy formation of films on the substrate by using a paste or slurry whose major component consists of a piezoelectric/electrostrictive powder having an average particle size of 0.1–5 μm, preferably 0.1–2 μm, which is advantageous for improved characteristics of the actuator produced. The planar films (6, 28) or film strips (17) may be suitably patterned and dimensioned by screen printing or photolithography, or by removing unnecessary portions of the applied material by laser cutting, ultrasonic cutting, or slicing or other mechanical machining operations. In particular, it is recommended to practice the laser cutting or mechanical machining method so as to form the piezoelectric films or film strips together with the ceramic substrate. This method is preferable when a relatively large number of units are provided on the substrate, as shown in FIGS. 7, 8, and 9.

The actuator as a whole or the electrode films or film strips may take any desired shape or configuration as described above with respect to the substrate, the configuration being selected depending upon the utility of the actuator.

The electrode and piezoelectric films or film strips (4, 6, 8, 16, 17, 22, 28) formed on the ceramic substrate 2 by the selected method as described above may be either heat-treated in different steps for integration with the substrate 2 after each of these films or film strips is formed, or concurrently heat-treated in one step for integration with the substrate after all of the films or film strips are formed into a laminar structure on the substrate 2. The heat-treatment or firing temperature for integration of the films or film strips (4, 6, 8, 16, 17, 22, 28) with the ceramic substrate 2 is generally within a range between 800° C. and 1500° C., preferably within a range between 1000° C. and 1400° C. To avoid a change in the composition of the piezoelectric/electrostrictive material during heat-treatment of the film or film strips (6, 17, 28), it is desirable to control the heat-treatment atmosphere, by heating with the evaporation source of the piezoelectric/electrostrictive material.

The electrode films or film strips (4, 8, 16, 22) used for each piezoelectric/electrostrictive unit may be formed of any electrically conductive material which can withstand an oxidizing heat-treatment atmosphere having a temperature as indicated above. For instance, the electrode films or film strips may be formed of a single metal, an alloy of metals, a mixture of a metal or alloy and an electrically insulating ceramic, or an electrically conductive ceramic. However, it is preferred that the electrode material has a major component which consists of a noble metal having a high melting point, such as platinum, palladium or rhodium, or an alloy such as silver-palladium alloy, silver-platinum alloy or platinum-palladium alloy. In particular, a material whose major component is platinum or a platinum alloy is preferred. The term "major component" is interpreted to mean a component whose content is at least 50% by volume of the entire electrode material.

The ceramic material to be added to a metal or alloy to provide the above-indicated mixture for the electrode films or film strips is preferably the same as the ceramic material for the ceramic substrate or the piezoelectric or electrostrictive ceramic material used for the piezoelectric film or film strips. Where the ceramic material used for the ceramic substrate is used as an additive to the material for the electrode films or film strips, the content of the ceramic additive is preferably within a range of 5–30% by volume. Where the piezoelectric or electrostrictive ceramic material is used as the additive for the electrode films or film strips, the content of the ceramic additive is preferably within a range of 5–20% by volume. It is particularly desirable to use a mixture of the ceramic material for the substrate and the ceramic material for the piezoelectric film or film strips, as a ceramic additive to be added to the material for the electrode films or film strips.

While the thickness of the electrode films or film strips of each piezoelectric/electrostrictive unit are suitably selected depending upon the application of the actuator, the first electrode film 4 of the transverse-effect type actuator of FIG. 2 is formed with a thickness of no more than 15 μm, preferably no more than 5 μm. The electrode strips 16 of the longitudinal-effect type actuator of FIG. 3 are formed with a thickness of more than 3 μm, preferably more than 10 μm, more preferably 20 μm.

The piezoelectric films or film strips (6, 17, 28) used in each unit may be formed of any piezoelectric or electrostrictive material which produces a relatively large amount of strain or displacement due to the converse or reverse piezoelectric effect or the electrostrictive effect, as is well known in the art. The piezoelectric or electrostrictive material may be a semi-conductor material, or a dielectric or ferroelectric ceramic material. Further, the piezoelectric or electrostrictive material may either require a treatment for initial polarization or poling, or may not require such a polarization treatment.

The piezoelectric/electrostrictive composition used for the piezoelectric films or film strips (6, 17, 28) preferably consists of an oxide including lead (Pb). It is particularly desirable to use, as a major component of the composition, lead zirconium titanate (PZT), lead magnesium niobate (PMN), lead nickel niobate (PNN), lead zinc niobate, lead manganese niobate, lead antimony stannate, lead titanate, or a mixture thereof. Further, a material (such as PLZT) containing an oxide or compound of lanthanum (La), barium (Ba), niobium (Nb), Zinc (Zn), nickel (Ni) and/or manganese (Mn) may be added to the piezoelectric or electrostrictive composition whose major component consists of PZT.

In view of the construction of the piezoelectric/electrostrictive actuator according to the present invention, the piezoelectric constant $|d_{31}|$ of the material used for the planar piezoelectric films 6, 28 or film strips 17 is desirably at least $50 \times 10^{-12}$ [C/N], more desirably at least $100 \times 10^{-12}$ [C/N], or the piezoelectric constant $|d_{33}|$ is desirably at least $100 \times 10^{-12}$ [C/N], more desirably at least $200 \times 10^{-12}$ [C/N], for assuring excellent operating characteristics of the actuator.

Specimens of the transverse-effect type piezoelectric/electrostrictive actuator as shown in FIG. 2 were produced. There will be described the manner in which these specimens were produced, and a relationship between the measured piezoelectric constant of the specimens and the measured amount of lead contained in the grain boundaries of the ceramic substrates of the specimens.

Each specimen used the ceramic substrate 2 which has a thickness of 50μm and whose major component is aluminum oxide. On this ceramic substrate 2, there was first formed by screen printing an unfired layer for the first electrode film 4. After this unfired layer was fired, an unfired layer for the piezoelectric film 6 was formed by screen printing on the first electrode film 4. After this unfired layer for the film 6 was fired, the second electrode film 8 was formed by sputtering on the piezoelectric film 6. In this manner, the several specimens of the actuator of FIG. 2 were prepared. The first electrode film 4 was formed of a composition whose major component is platinum. That is, the composition of the film 4 consists of 85% by volume of platinum, 10% by volume of piezoelectric or electrostrictive material and 5% by volume of zirconium oxide. The piezoelectric film 6 was formed of a composition whose major component is lead magnesium niobate. That is, the composition of the film 6 consists of 37 mole % of lead titanate, 24 mole % of lead zirconate and 39 mole % of lead magnesium niobate. The second electrode film 8 was formed of gold. The thicknesses of the first electrode film 4 and the piezoelectric film 6 were adjusted to 5 μm and 30 μm, respectively, while the second electrode film 8 was formed with a thickness of 0.3 μm.

The unfired layer for the first electrode film 4 was fired at 1200° C., while that for the piezoelectric film 6 was fired at 1250° C. The amounts of lead oxide contained in the firing atmospheres for the film 6 and the firing times were adjusted for the individual specimens, so that the contents of lead which was diffused in the grain boundaries of the ceramic substrate 2 through the films 4, 6 were controlled to the values indicated in TABLE 1, which were confirmed by measurement of lead oxide contained in the grain boundaries of the substrate 2.

The piezoelectric constants $|d_{31}|$ of the individual actuator specimens having the different contents of lead were measured. The measured piezoelectric constants are also indicated in TABLE 1. Some of the samples of the specimen whose lead content is 0% suffered from flake-off or separation of the films 4, 6, 8 from the substrate 2.

TABLE 1

| Contents (wt %) of Lead in Grain Boundaries | Piezoelectric Constants $|d_{31}|$ ($\times 10^{-12}$ C/N) |
|---|---|
| 0 | <5 |
| 20 | 10 |
| 40 | 50 |
| 50 | 100 |
| 60 | 250 |
| 65 | 270 |
| 70 | 280 |
| 90 | 300 |

It will be understood from TABLE 1 that the piezoelectric constants of the specimens whose lead content of the grain boundaries of the substrate 2 is 40% by weight or higher is sufficiently high, and that the piezoelectric constant is considerably high increases when the lead content is 50% or higher.

What is claimed is:

1. A piezoelectric/electrostrictive actuator having at least one piezoelectric/electrostrictive unit each including a first electrode film, a piezoelectric/electrostrictive film and a second electrode film which are superposed on each other on a ceramic substrate, or at least one piezoelectric/electrostrictive unit each including a plurality of patterned spaced-apart electrode film strips formed on a ceramic substrate, and a plurality of patterned spaced-apart piezoelectric/electrostrictive film strips which are formed on said ceramic substrate and each of which is disposed between and in contact with adjacent ones of said electrode film strips, the ceramic substrate includes ceramic particles and grain boundaries defined by said ceramic particles, wherein the improvement comprises:

lead element contained in the grain boundaries existing in at least a selected portion of said ceramic substrate on which said at least one unit is disposed.

2. A piezoelectric/electrostrictive actuator according to claim 1, wherein said grain boundaries contain at least 40% by weight of lead element.

3. A piezoelectric/electrostrictive actuator according to claim 1, wherein said ceramic substrate includes at least one major component selected from the group consisting of aluminum oxide, magnesium oxide, zirconium oxide, aluminum nitride and silicon nitride.

4. A piezoelectric/electrostrictive actuator according to claim 1, wherein said ceramic substrate includes silicon oxide in an amount of 0.5-5% by weight.

5. A piezoelectric/electrostrictive actuator according to claim 1, wherein a plurality of piezoelectric/electrostrictive units are formed on said ceramic substrate, such that said units are spaced from each other in a direction parallel to opposite major surfaces of said substrate.

6. A piezoelectric/electrostrictive actuator according to claim 1, wherein a plurality of piezoelectric/electrostrictive units are formed on said ceramic substrate, such that said units are superposed on each other.

7. A piezoelectric/electrostrictive actuator according to claim 1, wherein said ceramic substrate has a thickness of no more than 100 μm.

8. A piezoelectric/electrostrictive actuator according to claim 7, wherein at least said first electrode film or said electrode film strips includes at least one major component selected from the group consisting of: noble metals which consist of platinum, palladium and rhodium and which have a high melting point; alloys including silver and palladium; alloys including silver and platinum; and alloys including platinum and palladium.

9. A piezoelectric/electrostrictive actuator according to claim 1, wherein the grain boundaries in an entire portion of said ceramic substrate contain lead element.

10. A piezoelectric/electrostrictive actuator according claim 1, wherein the grain boundaries in said selected portion of said ceramic substrate contain lead in the form of an oxide.

11. A piezoelectric/electrostrictive actuator according to claim 1, which has a piezoelectric constant $|d_{31}|$ of at least $50 \times 10^{-12}$ C/N.

* * * * *